(12) United States Patent
Ding et al.

(10) Patent No.: US 6,352,926 B1
(45) Date of Patent: Mar. 5, 2002

(54) STRUCTURE FOR IMPROVING LOW TEMPERATURE COPPER REFLOW IN SEMICONDUCTOR FEATURES

(75) Inventors: Peijun Ding; Imran Hashim, both of San Jose; Barry L. Chin, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/709,991

(22) Filed: Nov. 10, 2000

Related U.S. Application Data

(62) Division of application No. 09/199,965, filed on Nov. 25, 1998.

(51) Int. Cl.$^7$ ................................................ H01L 21/44
(52) U.S. Cl. ...................................... 438/687; 435/734
(58) Field of Search ............................... 438/672, 687, 438/720, 734, 742, 396, 654, 682, 698, 760

(56) References Cited

U.S. PATENT DOCUMENTS

| | | | |
|---|---|---|---|
| 5,186,718 A | 2/1993 | Tepman et al. | 29/25.01 |
| 5,236,868 A | 8/1993 | Nulman | 437/190 |
| 5,246,885 A | 9/1993 | Braren et al. | 437/225 |
| 5,312,509 A | 5/1994 | Eschbach | 156/345 |
| 5,354,712 A | 10/1994 | Ho et al. | 437/195 |
| 5,478,455 A | 12/1995 | Actor et al. | 204/192.13 |
| 5,586,673 A | 12/1996 | Joshi et al. | 257/751 |
| 5,654,232 A | 8/1997 | Gardner | 438/661 |
| 5,939,788 A | 8/1999 | McTeer | 257/751 |
| 5,968,847 A * | 10/1999 | Ye et al. | 438/734 |
| 5,989,623 A | 11/1999 | Chen et al. | 427/97 |
| 6,224,737 B1 * | 5/2001 | Tsai et al. | 205/123 |

FOREIGN PATENT DOCUMENTS

| | | | |
|---|---|---|---|
| EP | 0878843 | 11/1998 | H01L/21/768 |
| WO | WO 9827585 | 6/1998 | H01L/21/768 |

OTHER PUBLICATIONS

U.S. application No. 08/924,487, of Ngan et al., filed Aug. 23, 1997.

U.S. application No. 08/995,108, of Ding et al., filed Dec. 19, 1997.

* cited by examiner

*Primary Examiner*—David Nelms
*Assistant Examiner*—Phuc T. Dang
(74) *Attorney, Agent, or Firm*—Shirley L. Church

(57) ABSTRACT

We have discovered that complete copper filling of semiconductor features such as trenches and vias, without the formation of trapped voids, can be accomplished using a copper reflow process when the unfilled portion of the feature structure prior to reflow comprises a capillary within the feature, wherein the volume of the capillary represents between about 20% and about 90%, preferably between about 20% and about 75% of the original feature volume prior to filling with copper. The aspect ratio of the capillary is preferably at least 1.5. The maximum opening dimension of the capillary is less than about 0.8 $\mu$m. The preferred substrate temperature during the reflow process includes either a soak at an individual temperature or a temperature ramp-up or ramp-down where the substrate experiences a temperature within a range from about 300° C. to about 600° C., more preferably between about 300° C. and about 450° C. By controlling the percentage of the volume of the feature which is unfilled at the time of the reflow process and taking advantage of the surface tension and capillary action when the aspect ratio of the feature is at least 1.5, the copper fill material is easily pulled into the feature which comprises the capillary without the formation of voids along the walls of the feature. The preferred method of application of the last layer of copper prior to reflow (the layer of copper which produces the unfilled capillary within the feature) is electroplating, although CVD or evaporation or other conformal layer formation techniques may be used.

7 Claims, 2 Drawing Sheets

STRUCTURE FOR IMPROVING LOW TEMPERATURE COPPER REFLOW IN SEMICONDUCTOR FEATURES

This application is a division of application Ser. No. 09/199,965 filed Nov. 25, 1998.

BACKGROUND OF THE INVENTION

1. Field of the Invention

The present invention pertains to a structure and method which enables improved step coverage and reflow in copper-filled semiconductor features.

2. Brief Description of the Background Art

Due to the difficulty in etching a copper film to provide a desired semiconductor interconnect pattern, one of the preferred methods of providing copper interconnects is the damascene process, which requires the filling of embedded trenches and/or vias.

A typical damascene process for producing a multilevel structure having feature sizes in the range of 0.5 micron ($\mu$) or less would include: blanket deposition of a dielectric material; patterning of the dielectric material to form openings; deposition of a conductive material onto the substrate in sufficient thickness to fill the openings; and removal of excessive conductive material from the substrate surface using a chemical reactant-based process, mechanical method, or combined chemical-mechanical polishing techniques. Currently the conductive material is typically deposited using chemical vapor deposition (CVD), evaporation, and sputtering.

Copper fill of a feature such as a trench or via using chemical vapor deposition (CVD) tends to create voids in the center of the filled opening, because CVD provides a conformal layer over the interior surface of the trench or via and eventually small voids are entrapped as some areas of the feature interior surface grow to touch each other. This is particularly true with regard to high aspect ratio features. Further, contaminants from the deposition source are frequently found in the deposited conductive material. Evaporation is successful in covering shallow features, but is generally not practical for the filling of high aspect ratio features.

Sputtered copper may be used to provide copper fill, if used in combination with a reflow of the copper to avoid the formation of voids which may otherwise occur along the sidewalls of the openings. A typical sputtering technique for filling of high aspect ratio features of less than about 0.5 $\mu$m includes cold (typically below about 150° C.) deposition of sputtered copper over the feature surface (which commonly comprises a silicon oxide base overlaid by a barrier layer such as tantalum, which is further overlaid by a seed layer of copper having the desired crystalline orientation). The cold deposition of the sputtered copper layer promotes adhesion of the copper to the substrate surface. The cold sputter deposition is followed by an annealing process (without deposition) at temperatures in excess of about 400° C., to reflow the copper and obtain filling of the trench or via. However, such a reflow process typically requires hours, due to the low bulk diffusivity of copper.

Although use of a reflow process to fill features such as trenches and vias is the simplest method of filling, present conventional processes require either a particularly high temperature (about 450° C. or higher, for example) or a long reflow time (typically about 15 minutes or longer). As the feature size of semiconductor patterned metal features has become increasingly smaller, the danger of trapping void spaces within the copper fill volume during the reflow process has increased.

U.S. Pat. No. 5,246,885 to Braren et al., issued Sep. 21, 1993, describes the problems listed above, and proposes the use of a laser ablation system for the filling of high aspect ratio features. Alloys, graded layers, and pure metals are deposited by ablating targets comprising more than one material using a beam of energy to strike the target at a particular angle. The ablated material is said to create a plasma composed primarily of ions of the ablated material, where the plasma is translated with high directionality toward a surface on which the material is to be deposited. The preferred source of the beam of energy is a UV laser. The heating of the deposition surface is limited to the total energy deposited by the beam, which is said to be minimal.

U.S. Pat. No. 5,312,509 of Rudolph Eschbach, issued May 17, 1974, discloses a manufacturing system for low temperature chemical vapor deposition of high purity metals. In particular, a semiconductor substrate including etched patterns is plasma cleaned; subsequently, the substrate is coated with adhesion and nucleation seed layers. A reactor connected to the process chamber containing the substrate sublimes a precursor of the metal to be deposited, which is then transported to the substrate. A reactor heat transfer system provides selective reactor cooling and heating above and below the precursor sublimation temperature under the control of programmable software. The heated chuck on which the substrate sits heats the substrate above the dissociation temperature of the precursor, releasing the metal from the precursor onto the substrate to nucleate the metal species onto the seed layer on the substrate. Although an adhesion barrier layer (and a sputtered seed layer if required) are said to be deposited using sputter deposition, the copper layer is applied solely by CVD deposition, to avoid the sidewall voiding which is said to occur if sputtering is used for the copper deposition.

U.S. Pat. No. 5,354,712 to Ho et al., issued Oct. 11, 1994, describes a method for forming interconnect structures for integrated circuits. Preferably, a barrier layer of a conductive material which forms a seed layer for metal deposition is provided selectively on the side-walls and bottom of interconnect trenches defined in a dielectric layer. Subsequently, a conformal layer of metal is selectively deposited on the barrier layer within the interconnect trench. The metal layer comprises copper which is deposited by chemical vapor deposition from an organo-metallic precursor at low temperatures. In particular, the layer of copper is deposited by CVD from copper (hexafluoroacetylacetonate) trimethyl vinylsilane compound by pyrolysis at low temperatures. This process suffers the problem of voids forming in the center of the filled opening, as previously described, and from the presence of contaminant residues from the precursor material which remain in the deposited metallic fill.

U.S. Pat. No. 5,585,673, issued to Joshi et al. on Dec. 17, 1996, discloses refractory metal capped low resistivity metal conductor lines and vias. In particular, the low resistivity metal is deposited using physical vapor deposition (e.g., evaporation or collimated sputtering), followed by chemical vapor deposition (CVD) of a refractory metal cap. Recommended interconnect metals include $Al_xCu_y$ (wherein the sum of x and y is equal to one and both x and y are greater than or equal to zero). The equipment required for collimated sputtering is generally difficult to maintain and difficult to control, since there is a constant build up of sputtered material on the collimator over time. Collimated sputtering is described in U.S. Pat. No. 5,478,455 to Actor et al., issued Dec. 26, 1995. Collimation, whether for sputtering or evaporation, is inherently a slow deposition process, due to the reduction in sputtered flux reaching the substrate.

It would be highly desirable to have a method for filling of semiconductor interconnect features which does not require the use of particularly complex equipment; which provides good step coverage for small, high aspect ratio features, while avoiding void formation; which can be carried out at temperatures below about 450° C.; and, which does not require a long processing time (in excess of about 15 minutes).

SUMMARY OF THE INVENTION

It has been discovered that copper filling of semiconductor features such as trenches and vias without the formation of trapped voids can be accomplished using a copper reflow process when the unfilled portion of the feature structure prior to reflow comprises a capillary within the feature, wherein the volume of the capillary represents between about 20% and about 90% of the original feature volume which is to be completely filled with copper. The aspect ratio of the capillary is preferably at least 1.5. The maximum opening dimension of the capillary is less than about 0.8 μm. The preferred copper temperature during the reflow process includes either an individual temperature or a temperature ramp-up or ramp-down within a temperature range from about 300° C. to about 600° C., more preferably between about 300° C. and about 450° C. By controlling the percentage of the volume of the feature which is unfilled at the time of the reflow process and taking advantage of the surface tension and capillary action when the aspect ratio of the feature is at least 1.5, the copper fill material is easily pulled into the feature which comprises the capillary without the formation of voids along the walls of the feature. The portion of the capillary which remains after the reflow process is easily filled using standard sputtering techniques which are commonly used in the art. To assist the capillary action during the reflow process, the corners of trenches and vias (and other features) can be beveled and the walls tapered using a soft sputter etch pre-clean process, preferably prior to application of the barrier layer which typically underlies the copper fill. The shaping of the interior of the feature can be done after deposition of the barrier layer when the barrier layer is sufficiently thick to permit this.

The preferred method of application of the last layer of copper prior to reflow (the layer of copper which produces the unfilled capillary within the feature) is electroplating, although CVD or evaporation or other conformal layer formation techniques may be used. Electroplating provides a clean metal layer while providing improved control over the dimensions of the unfilled capillary which helps avoid trapping of void volumes within the capillary.

The surface diffusion characteristics of copper over the temperature range given above enable the complete filling of capillaries having an aspect ratio of 1.5 or greater where the maximum capillary opening dimension is 0.8 μm or less.

DETAILED DESCRIPTION OF THE PREFERRED EMBODIMENTS

Figure 1:
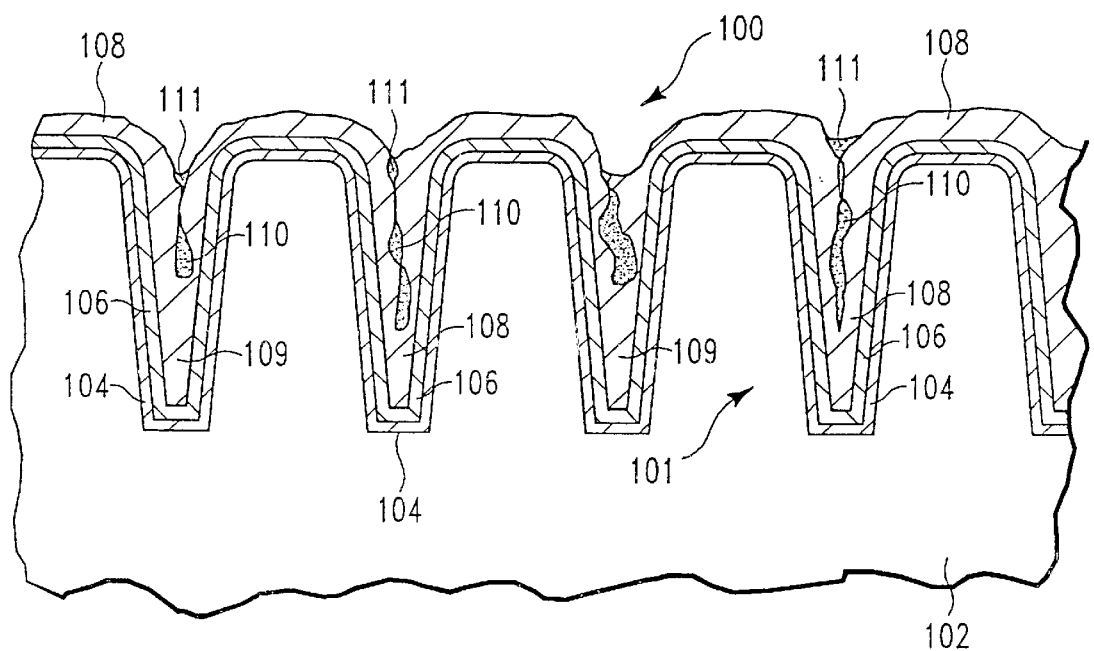
FIG. 1 shows a schematic of a scanning electron microscope (SEM) cross-sectional image of a prior art copper filled trench formed using a copper reflow technique.

The present invention pertains to a partially copper filled feature structure which can be reflowed to produce a void free copper fill and to a method of forming a void free copper-filled feature. In particular, the partially copper filled structure comprises a capillary within the feature, wherein volume of the capillary represents between about 20% and about 90% of the feature volume which is to be completely filled with copper. The aspect ratio of the capillary is at least 1.5, and preferably the maximum opening dimension of the capillary is less than about 0.8 μm.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF or DC glow discharge, and reference to "copper" includes alloys thereof.

Specific terminology of particular importance to the description of the present invention is defined below.

The term "aspect ratio" refers to, but is not limited to, the ratio of the height dimension to the width dimension of a particular feature. When the feature has more than one width dimension, the aspect ratio is typically calculated using the smallest width dimension of the feature. For example, a contact via opening which typically extends in a tubular form through multiple layers has a height and a diameter, and the aspect ratio would be the height of the tubular divided by the diameter. The aspect ratio of a trench would be the height of the trench divided by the minimal width of the trench, which typically occurs at its base.

The term "completely filled" refers to the characteristic of the copper-filled feature, wherein there is essentially no void space present in the copper-filled feature.

The term "copper" refers to copper and alloys thereof, wherein the copper content of the alloy is at least 80 atomic %. The alloy may comprise more than two elemental components.

The term "decoupled plasma source" refers to a plasma generation apparatus which has separate controls for power input to a plasma source generator and to a substrate bias device. Typically the plasma source controller controls the supply of inductively coupled RF power which determines plasma density (source power) and the bias controller controls the supply of RF power or DC power which is used to generate a DC bias voltage on the semiconductor substrate surface (bias power). The bias voltage affects the ion bombardment energy on the substrate surface. This decoupled plasma source typically incorporates measures to separate (decouple) the influence of the source power and bias power on one another. The ENDURA® metal deposition system and CENTURA® metal etch system available from Applied Materials, Inc. of Santa Clara, Calif. which include decoupled plasma source power and bias power control are referred to as "DPS" systems. Similar equipment available from other manufactures may be referred to by different nomenclature.

The term "essentially void free feature" refers to, but is not limited to, a feature which comprises a volumetric opening or space which is filled with a deposited material, wherein the filled volume is essentially free of void spaces.

The term "feature" refers to, but is not limited to, contacts, vias, trenches, and other structures which make up the topography of the substrate surface.

The term "ion-deposition sputtered" and the term "ion metal plasma (IMP) refer to sputter deposition, preferably magnetron sputter deposition (where a magnet array is placed behind the target). A high density, inductively coupled RF plasma is created between the sputtering cathode and the substrate support electrode, whereby at least a portion of the sputtered emission is in the form of ions at the time it reaches the substrate surface.

The term "IMP sputtered copper" or "IMP copper" refers to a copper deposition which was sputtered using the IMP sputter deposition process.

The term "reactive ion deposition" or "reactive ion metal plasma (IMP)" refers to ion-deposition sputtering wherein a reactive gas is supplied during the sputtering to react with the ionized material being sputtered, producing an ion-deposition sputtered compound containing the reactive gas element.

The term "SEM" refers to a scanning electron microscope.

The term "standard copper deposition" or "traditional sputtering" refers to a method of forming a film layer on a substrate wherein a target is sputtered and the material sputtered from the target passes between the target and the substrate to form a film layer on the substrate, and no means is provided to ionize a substantial portion of the material sputtered from the target before it reaches the substrate.

II. An Apparatus for Practicing the Invention

A process system which can be used to carry out the pre-cleaning step, the deposition of barrier layers and the deposition of copper seed layers is the ENDURA® Integrated Processing System available from Applied Materials, Inc. (Santa Clara, Calif.) The system is shown and described in U.S. Pat. Nos. 5,186,718 and 5,236,868, the disclosures of which are incorporated by reference. This system can also be used to carry out the reflow process; however, it may be economically advantageous to carry out the reflow process in a large furnace which processes a large number of substrates simultaneously.

When it is desired to apply a conformal layer of copper using an electroplating process, this is preferably done in an electroplating bath of the kind known in the art, wherein the reagents used in the electroplating process are of high purity. Electroplating of copper is further described in Ullmann'Encyclopedia of Industrial Chemistry, Sixth Edition, 1998, and electroplating equipment which can be used for copper plating of semiconductor surfaces is available from SEMITOOL® of Kalispell, Mont.

It is important that the semiconductor structure not be exposed to air or moisture after deposition of the barrier layer, until the remainder of process steps are complete through the reflow process, to avoid the formation of copper oxides and the corrosion of the copper in general within the interior of the feature.

III. The Method of the Invention

FIG. 1 shows a schematic of a photomicrograph cross-sectional view of a semiconductor structure 100 which includes a series of trenches 101 formed therein. The trenches 101 are typically etched in a dielectric substrate 102 (typically silicon dioxide).

When the underlying substrate in contact with copper is susceptible to diffusion by copper (as silicon dioxide is), the copper fill is preferably applied over a barrier layer, perhaps with a wetting layer overlying the barrier layer. The preferred embodiments described herein are with reference to a silicon oxide substrate having an overlying barrier layer. However, it is understood that should a dielectric substrate be used which is not subject to diffusion by copper, such a barrier layer would not be necessary. A barrier layer or a wetting layer (or both) applied over a silicon oxide surface may be applied by any technique known in the art, including CVD and evaporation, since the major drawbacks previously mentioned with regard to these application techniques is minimized when the underlying layer is a sufficiently thin layer. However, in the preferred embodiments described herein, these layers were applied using sputtering techniques which are described subsequently.

After the formation of trenches 101, a barrier layer 104 is applied over the surface of structure 100. Barrier layer 104 is typically tantalum or tantalum nitride when copper is used to fill the trench 101. Overlying barrier layer 104 is a "seed" layer of copper 106. The purpose of the seed layer is to improve the adhesion of the copper fill 109 to barrier layer 104 and to provide the desired crystalline structure (preferably <111>) for transfer to copper fill 109.

The copper fill may be applied using sputtering techniques under specialized conditions, such as those described in co-pending U.S. patent application Ser. No. 08/855,059, filed May 13, 1997, titled: "Method of Sputtering Copper to Fill Trenches and Vias". This patent application is assigned to the assignee of the present invention and is hereby incorporated by reference in its entirety.

In particular, the copper fill layer may be applied in a single step sputtering process or in a two step sputtering process. In the single step process, for feature sizes of about 0.75 µm or less, when the aspect ratio of the feature to be filled is less than approximately 3: 1, the temperature of the substrate to which the copper fill layer is applied should range from about 200° C. to about 600° C. (preferably, from about 200° C. to about 500° C.); when the aspect ratio is about 3: 1 or greater, the copper fill layer should be applied over a temperature ranging from about 200° C. to about 600° C. (preferably, from about 300° C. to about 500° C.). The deposition can be initiated at the low end of the temperature range, with the temperature being increased during deposition.

The application of both a seed layer and a fill layer may be carried out using a sputtering process in which the seed layer, a thin, continuous wetting (bonding) layer of copper, is applied at a substrate surface temperature of about 20° C. to about 250° C. The seed/wetting layer thickness (on the wall of a trench or via) should be a minimum of about 50 Å, and typically may be about 100 Å to about 300 Å, depending on feature size and aspect ratio. Subsequently, the temperature of the substrate is increased, with the application of fill copper beginning at about 200° C. or higher and continuing as the temperature is increased to that appropriate for the feature size. When both the copper seed layer and the copper fill layer are applied in a single process chamber, the deposition may be a continuous deposition. In such case, process conditions are varied during the deposition, with the copper fill layer being applied at a slower rate than the copper seed layer, to provide better deposition control.

The copper sputtering technique used is selected from Gamma deposited copper, coherent copper, ion deposition sputtered copper, and traditional standard sputter deposition copper. Gamma deposited copper refers to non-collimated magnetron sputtered copper which is sputtered at low process chamber pressures, with improved directionality of the depositing atoms. The improved directionality is achieved by increasing the distance between the target cathode and the workpiece surface and by reducing the process gas pressure during sputtering. Typically, the distance between the substrate and the target is about the diameter of the substrate or greater; and, preferably, the process gas pressure is sufficiently low that the mean free path for collision within the process gas is greater than the distance between the target and the substrate.

The copper fill may also be applied using techniques which provide a conformal layer of copper, such as CVD, evaporation, or electroplating. However, such methods of filling the feature with a conformal copper layer 108 frequently trap voids (spaces which contain no copper) within the copper fill 109. FIG. 1 shows these voids 110 trapped within copper fill 109 when the internal surface 111 of the copper conformal layer 108 makes contact and closes above an interior area 110 which is not completely filled. As feature sizes fall below 0.25 μm, this is becoming a more common problem.

Figure 2:
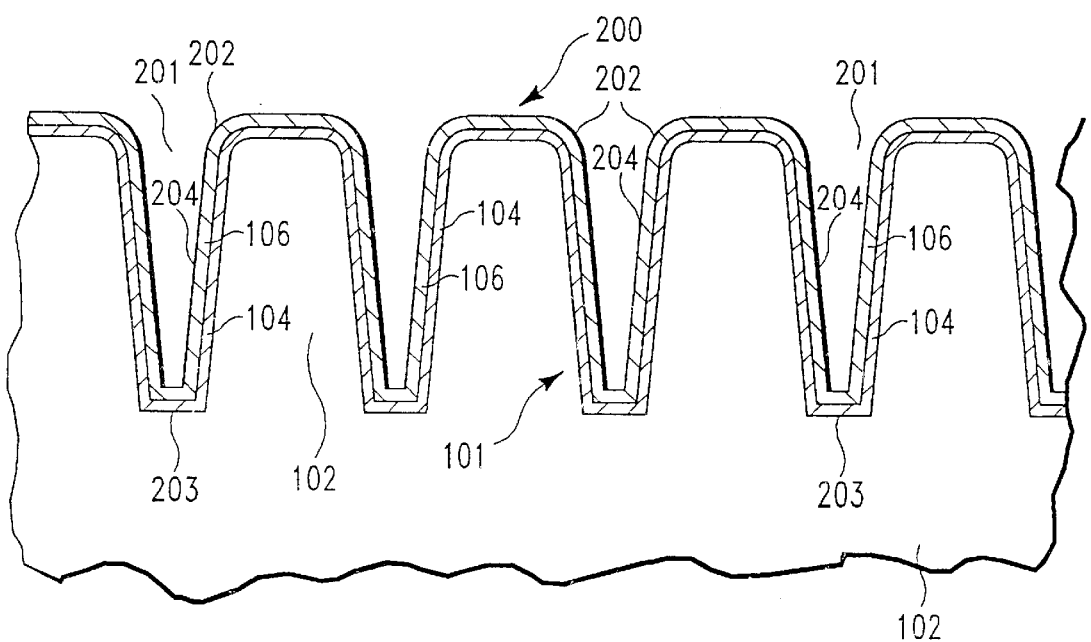
FIG. 2 shows a schematic of a scanning electron microscope (SEM) cross-sectional image of a silicon oxide substrate having trenches in its surface, with a barrier layer deposited over the substrate surface, and a seed layer of copper deposited over the barrier layer.

FIG. 2 shows a schematic of a photomicrograph cross-sectional view of a semiconductor structure 200 prior to the deposition of a copper fill layer. Semiconductor structure 200 includes a series of trenches 101 etched in a dielectric substrate 102. The trenches 101 are approximately 0.3 μm wide at their base 203 and approximately 0.75 μm high, so that the trenches 101 have an aspect ratio of about 2.4:1. The interior surface of trenches 101 has been shaped so that the upper corners 202 of the trench wall are rounded and so that the trench walls 204 are tapered so that they are wider toward the top 201 of the trench 101 and narrower toward the bottom 203. FIG. 2 is not to scale and some of the dimensions have been exaggerated for purposes of illustration.

A barrier layer 104 of tantalum about 300 Å thick was applied over the surface of dielectric substrate 102. The barrier layer 104 was applied under conditions generally known in the art which ensure that the barrier layer formed is amorphous. A "seed" layer of copper 106 about 1,200 Å thick was applied over the surface of tantalum barrier layer 104. The seed layer of copper was applied under conditions which ensured that the seed layer would have a high concentration of <111>crystal orientation, preferably 100% <111>. The seed layer 106 of copper was applied at a substrate surface temperature which was within a temperature range from about 20° C. to about 150° C. Methods for applying barrier layers and seed layers to ensure a copper fill layer having 100% <111>crystal orientation are described in U.S. patent applications, Ser. No. 08/924,487, Filed Aug. 23, 1997, titled: "Method Of Forming A Barrier Layer Which Enables A Consistently Highly Oriented Crystalline Structure In A Metallic Interconnect"; and, 08/995,108, filed Dec. 16, 1997, titled: "A Tailored Barrier Layer Which Provides Improved Copper Interconnect Electromigration Resistance". All three applications are assigned to the assignee of the present invention. These patent applications are hereby incorporated by reference in their entirety. The barrier layer 104 and seed layer 106 were applied using ion-deposition sputtering in an apparatus where the control of the power input to the plasma source generator was separate from the control of the power input to the substrate bias device (a decoupled plasma source).

EXAMPLE

The preferred embodiments described herein were produced in a process chamber capable of processing a 200 mm diameter silicon wafer. The substrate was a silicon wafer having an overlying silicon oxide layer about 12,000 Å thick. The surface of the silicon oxide layer was patterned with trenches having a feature size of about 0.3 μm. Overlying the patterned surface was a barrier layer of tantalum about 300 Å thick, and overlying the tantalum barrier layer was a copper seed layer having a thickness of about 1,200 Å. FIG. 2 is representative of the semiconductor structure of the preferred embodiment prior to deposition of a copper fill layer.

Figure 3A:
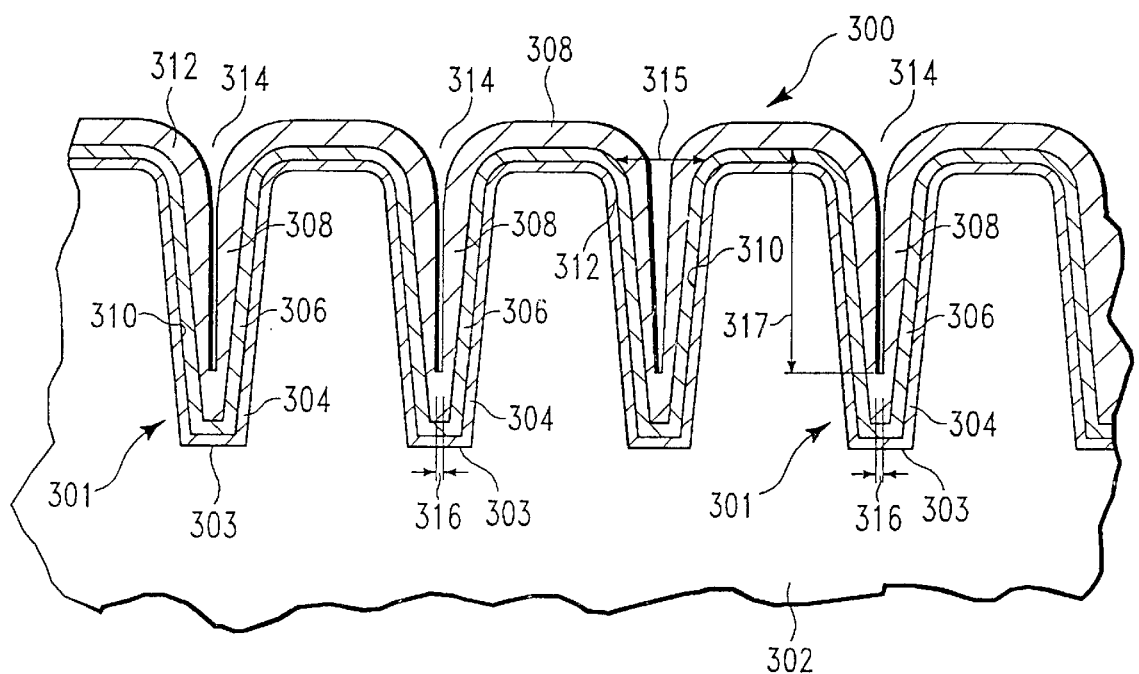
FIG. 3A shows a schematic of the trench structure shown in FIG. 2, after deposition of a conformal layer of copper which is designed so that at least 20% of the copper fill of the feature is completed.

FIG. 3A is a schematic of a photomicrograph of the semiconductor structure 300. This structure shows the structure of FIG. 2 after deposition of a copper fill layer 308. The copper fill layer 308 is deposited in a conformal manner, and in an amount such that a capillary 314 is formed in the center of the trench feature 301. It is this capillary 314 which enables complete filling of trench feature 301 upon reflow of copper fill layer 308, without trapping void spaces within trench feature 301.

In particular, semiconductor structure 300 includes a series of trenches 301 etched in a dielectric substrate 302. The trenches 301 are approximately 0.3 μm wide at their base 303 and approximately 0.75 μm high, so that the trenches 301 have an aspect ratio of about 2.4:1. The interior surfaces of trenches 301 were shaped prior to application of barrier layer 304 and copper seed layer 306 so that the upper corners 312 of the trench wall after application of seed layer 306 were rounded and so that the trench walls 310 were tapered (so that the spacing between trench walls 310 was wider toward the top 315 of the trench 301 and narrower toward the bottom 303). FIG. 3A is not to scale and some of the dimensions are exaggerated for purposes of illustration.

The shaping of the interior surfaces of trenches 301 was done using a soft sputter etch with an argon plasma. This sputter etching is referred to as a pre-clean step, as it is used to remove debris from the internal surface of the trenches as well as to shape the upper corners and taper the walls of trenches 301. The ENDURA® process chamber in which the pre-clean step was carried out is sized for a 200 mm diameter semiconductor wafer. The argon flow rate into the process chamber was set at about 5 sccm; and the RF plasma source power was set at about 400 kHz and about 300 W. The power supply to the semiconductor substrate support platen, which was used to create a substrate bias, was set at about 13.5630 MHZ and about 300 W, to produce a bias on the substrate of about −275 V. The pressure in the process chamber was about 0.5 mT, the substrate temperature was about 300° C., and the pre-clean time was about 25 seconds. Under these conditions, the pre-clean step removed about 250 Å of silicon dioxide from the field surface of the substrate.

The tantalum barrier layer 304 of about 300 Å in thickness was applied using ion-deposition sputtering. The ion-deposition-sputtered (IMP-sputtered) tantalum film was produced using a high density, inductively coupled RF plasma which was generated in the region between the tantalum target cathode and the substrate by applying RF power to a coil (having from 1 to 3 turns). The RF power to the coil was at a frequency of about 2 MHZ, and preferably ranges from about 400 kHz to about 50 MHZ. The wattage to the RF power coil was about 2 kW, and preferably ranges from about 1.0 kW to about 5 kW. The ionization coil increases the number of ions from the plasma which reach the substrate surface.

The distance from the tantalum cathode to the substrate was typically about 14 cm (5.5 inches), with the ionization coil being located about 4.5 cm from the cathode, toward the substrate. The tantalum target cathode had a diameter of approximately 35.3 cm (14 in.), and DC power was applied to this cathode at about 1 kW. (The DC power to the tantalum target may be adjusted over a range from about 0.5 kW to about 8 kW, and is preferably set at about 1 kW to about 3 kW).

An AC bias power at a frequency of about 13.5 MHZ and about 350 W was used to produce an offset bias of about –70 V on the substrate surface. Preferably, the bias power ranges from about 0 W to about 500 W and the bias offset voltage ranges from about 0 V to about –100 V. The substrate offset bias attracts ions from the plasma to the substrate.

Argon gas was used as the plasma source gas and was fed into the process chamber at a rate of about 50 sccm. The process chamber pressure was about 2 mT, although this pressure can be adjusted within a range from about 1 mT to about 60 mT. The substrate temperature was about 300° C., and preferably is less than about 350° C. The sputtering time, to provide the 300 Å thick barrier layer was about 20 seconds.

The copper seed layer 306 of about 1,200 Å in thickness was applied using ion-deposition sputtering techniques designed to maximize the copper <111>crystallographic content of the copper seed layer. The spacing between the copper target cathode, the RF-powered ionization coil, and the substrate was essentially the same as that described previously for the tantalum barrier layer 304 deposition.

In particular, IMP sputtering was carried out using a copper target cathode having a 14 inch (35.3 cm) diameter, and about 2 kW of DC power was applied to this cathode (preferably the DC power ranges from about 1 kW to about 5 kW). The RF power to the ionization coil was at a frequency of about 2 MHZ, and preferably ranges from about 400 kHz to about 50 MHZ. The wattage to the RF power coil was about 2 kW, and preferably ranges from about 1.0 kW to about 5 kW. An AC bias power at a frequency of about 13.5 MHZ and about 350 W was used to produce an offset bias of about –70 V. Preferably the bias power ranges from about 0 W to about 500 W and the bias voltage ranges from about 10 V to about –100 V. The atmosphere in the process vessel was argon, the flow rate of the argon ranged from about 6 sccm to about 140 sccm and the process vessel pressure was about 20 mT. Preferably the process vessel pressure ranges from about 5 mT to about 60 mT. The substrate temperature during deposition of copper seed layer 306 was about 70° C. Preferably the substrate temperature is less than about 150° C.

Copper fill layer 308 was deposited using electrolytic plating of copper from a high purity copper sulfate plating solution at a current density ranging between about 10 milliamps/ cm$^2$ and about 100 milliamps/ cm$^2$, using techniques known in the art. The electrolytic plating provided a conformal layer over the inner surface of trench 301. The amount of copper fill layer 308 deposited was such that approximately 20% of the copper fill volume of trench 302 was left unfilled, resulting in the formation of capillary 314. Capillary 314 had a base width 316 of about 0.06 $\mu$m and a height 317 of 0.41 $\mu$m, so that the aspect ratio was about 6.8:1.

Although copper fill layer 308 can be deposited using any conformal technique, such as CVD or evaporation, electroplating is preferred. In electroplating of the copper fill layer 308, the plating bath dissolves the surface of copper seed layer 306, producing a fresh, clean surface onto which copper fill layer 308 can grow. This provides reduced resistivity in the copper fill as a whole (providing for the removal of any copper oxide which may be present) and assists in obtaining the desired <111> crystallographic content in the copper fill.

Figure 3B:
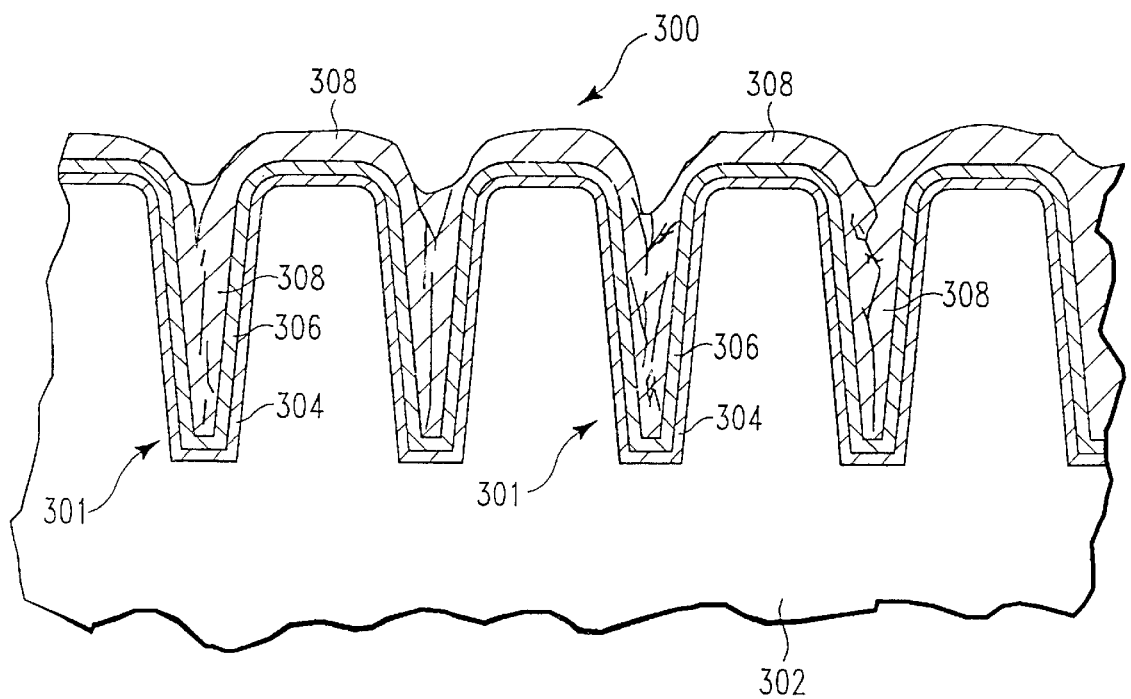
FIG. 3B shows a schematic of the trench structure shown in FIG. 3 after reflow of the copper fill within the trench structure.

Copper fill layer 308 was then reflowed to fill capillary 314, as shown in FIG. 3B. Due to the diffusion properties and surface tension of copper, and the capillary action within capillary 314, trenches 301 were completely filled with copper, with no entrapment of void spaces. When the aspect ratio is about 3:1 or greater, the copper reflow should be carried out at a temperature of at least 450° C. Preferably the copper reflow is carried out at a copper temperature or over a temperature ramp within a temperature range from about 200° C. to about 600° C., and more preferably from about 300° C. to about 500° C. In the present instance, reflow was initiated at about 150° C. and continued to a temperature of about 400° C. over a time period of 5 minutes. The length of time required for reflow depends on the substrate temperature and the aspect ratio of the capillary (or the empty volume of the partially filled trench).

The reflow was carried out in an ENDURA® processing chamber. The atmosphere in the reflow chamber was essentially oxygen-free. The pressure in the reflow chamber was $3\times10^{-8}$ Torr.

One skilled in the art can envision a number of possible semiconductor structures where the present invention could be used to ensure the complete filling of copper interconnect and contact features. Such semiconductor structures may include the use of a dielectric substrate other than silicon dioxide (such as a low k polymeric dielectric substrate); may include the use of barrier layers other than tantalum, such as tantalum nitride or titanium nitride; may include a wetting layer of a material other than copper (such as aluminum); and may include the use of a copper fill layer applied by a techniques other than electrolytic plating. The above described preferred embodiments are not intended to limit the scope of the present invention, as one skilled in the art can, in view of the present disclosure expand such embodiments to correspond with the subject matter of the invention claimed below.

We claim:

1. A semiconductor precursor structure which can subsequently be processed to provide a copper-filled semiconductor feature, wherein the copper fill is a complete fill, which is essentially void free, said precursor structure including a feature located upon or within a semiconductor substrate, wherein said feature includes:

a) a copper fill layer over an interior surface of said feature; and b) a capillary interior to said copper fill layer, wherein said capillary represents between about 20% and about 90% of a volume of said feature, which volume is to be completely filled with copper, wherein an aspect ratio of said capillary is at least about 1.5:1, and wherein said capillary has an opening to a surface of said semiconductor substrate.

2. The semiconductor structure of claim 1, wherein a minimum opening dimension within said capillary ranges between about 0.06 μm and about 0.75 μm.

3. The semiconductor structure of claim 2 wherein a maximum opening dimension within said capillary is about 0.8 μm.

4. The semiconductor structure of claim 1, wherein said interior surface of said feature over which said copper fill layer is applied is a copper seed layer which was deposited using ion-deposition sputtering.

5. The semiconductor structure of claim 4, wherein said ion-deposition sputtering was carried out in an apparatus wherein a first power controller is used to control plasma generation, while a second power controller is used to control biasing of said semiconductor substrate.

6. The semiconductor structure of claim 1, wherein said copper fill layer is an electroplated layer.

7. The semiconductor structure of claim 1, wherein said copper fill layer is the product of a chemical vapor deposition process.

* * * * *